United States Patent [19]
Huddleston

[11] Patent Number: 5,445,306
[45] Date of Patent: Aug. 29, 1995

[54] WEDGE WIRE BONDING TOOL TIP

[75] Inventor: Wyatt A. Huddleston, Austin, Tex.

[73] Assignee: Motorola, Inc., Schaumburg, Ill.

[21] Appl. No.: 251,500

[22] Filed: May 31, 1994

[51] Int. Cl.[6] ...................... H01L 21/607; B23K 20/10
[52] U.S. Cl. ........................................ 228/1.1; 228/4.5
[58] Field of Search .................. 228/1.1, 4.5, 51, 55; 156/73.2, 580.2

[56] References Cited

U.S. PATENT DOCUMENTS

| | | | |
|---|---|---|---|
| 3,623,649 | 11/1971 | Keisling | 228/15.1 |
| 3,627,192 | 12/1971 | Killingsworth | 228/1.1 |
| 3,690,538 | 9/1972 | Gaiser et al. | 228/1.1 |
| 3,718,272 | 2/1973 | Eltzroth et al. | 228/3.1 |
| 3,863,827 | 2/1975 | Foulke et al. | 228/4.5 |
| 3,934,783 | 1/1976 | Larrison | 228/110.1 |
| 3,971,499 | 7/1976 | Goodrich, Jr. et al. | 228/54 |
| 4,030,657 | 6/1977 | Scheffer | 228/4.5 |
| 4,778,097 | 10/1988 | Hauser | 228/1.1 |
| 5,148,959 | 9/1992 | Cain et al. | 228/4.5 |
| 5,217,154 | 6/1993 | Elwood et al. | 228/4.5 |

OTHER PUBLICATIONS

Micro-Swiss product information on Fine Pitch Bonding Wedge, Models 41436, 44129, 49436, 40424, 40427, 40428, 40460, 44200.

Small Precision Tools product information on Auto Bonding Tools.

Gaiser Tool Company product information on Bonding Wedges.

Primary Examiner—Samuel M. Heinrich
Attorney, Agent, or Firm—Minh-Hien N. Clark

[57] ABSTRACT

A wedge bond tool tip (20, 30, 50, 56) for bonding electronic interconnects to bonding pads of a semiconductor device enables fine-pitch non-orthogonal wire bonding. The tool tip (20, 30, 50, 56) has an overall width and a front face (12', 52) that has a reduced area which is narrower than the overall width. The reduction in the front face is accomplished through either chamfering or rounding of the corners to reduce the contact distance (42 and 44) between the wedge tool and a previously made adjacent bond. This design maintains the structural integrity needed to produce acceptable wedge bonds.

15 Claims, 4 Drawing Sheets

WEDGE WIRE BONDING TOOL TIP

FIELD OF THE INVENTION

The present invention relates to a wire bonding tool in general, and more specifically to a wedge wire bonding tool for use in non-orthogonal wire bonding.

BACKGROUND OF THE INVENTION

Wedge wire bonding is typically performed in hermetic type semiconductor devices to provide electrical interconnection between the actual semiconductor chip or die and the next level interconnection. The semiconductor die has bonding pads on its active surface. These bonding pads are connected to leads of a leadframe through wire bonds. The wire bonding is accomplished through the use of wire bonding equipment.

An integral part of the wire bonding apparatus is the bonding tool. FIG. 1 illustrates a typical wedge bonding tool 10 as known in the art. For ease of illustration, only a bottom portion of the bonding tool is shown. The bonding tool 10 has a front face 12, a bore 14, and a tool foot 16. A bonding wire (not shown) would feed through the bore 14 and under the wedge tool foot 16. The bonding tool itself is attached to an ultrasonic power source (not shown). In the wire bonding process, the wire is clamped between the tool foot 16 and the bonding pad on the semiconductor die. Ultrasonic power is applied to the wire which fuses the wire to the bonding pad. The tool foot is rectangular in shape and normally twice the wire diameter in length and 3 to 4 times the wire diameter in width. The minimum width of the bonding tool is limited by the bore 14 because the bonding tool must have sufficient mass to withstand the compressional and ultrasonic forces applied during the formation of the wedge bond. The tool foot geometry, the magnitude of the clamping force, and the ultrasonic power determine the final shape of the bond.

Bonds made in this manner are usually elliptical in shape—approximately twice the wire diameter in width and 3 to 4 times the wire diameter in length. The conventional arrangement of wedge wire bonds made in this manner is that the resultant wire bonds are perpendicular to the edge of the semiconductor die. This configuration of wire bonds is commonly referred to as orthogonal, wherein the angle that the wire makes with the die, the "incident angle," is defined as 0°. Orthogonal wire bonding is usually performed sequentially around the periphery of the semiconductor die.

For semiconductor device packages which employ a fan-out pattern to the wire bonds, wherein the resultant wire bonds are not perpendicular to the die edge, wedge bonding with the known rectangular bonding tool can often result in damaged bonds. This configuration is known as non-orthogonal wire bond. The damage to the wire bonds takes the form of scores or scrapes on the bond caused by contact with the wedge tool foot 16 as an adjacent bond is being made. This contact damage can either occur between the front corner of the tool foot and the adjacent bond during the forward motion as the wedge bond is being made, or between the back corner of the tool foot and the adjacent bond during the reverse motion as the bonding tool is being moved after the bond is made. The damage to the adjacent bond can result in weakened bond strength and reduced device reliability. The bond damage can occur when the pitch between two adjacent bond-pads approaches the sum of ½ of the bond width and ½ of the wedge tool width, and non-orthogonal wire bonding is required. The minimum bond-pad pitch at which the wedge bond tool touches an adjacent bond is referred to as the "contact distance". The higher the incident angle becomes, the more likely the wedge tool is to contact and damage adjacent bonds during bonding. Due to these geometric constraints, the pitch between two adjacent bond-pads must be increased as the bond angle increases. Another issue surrounding the occurrence of a wedge tool to existing bond contact is that during the contact the wedge tool is in the process of creating another bond. Since the bond being created is not being subjected to the proper forces, the bond may have inferior bond-to-pad adhesion attributes and thus lead to subsequent reliability problems.

SUMMARY OF THE INVENTION

An embodiment of the invention provides a wedge wire bonding tool tip for bonding electronic interconnects to bonding pads of a semiconductor device. The tool tip has an overall width of a first dimension and a front face having a second dimension that is smaller than the first dimension. The tool tip has a chamfered face at a predetermined angle that connects the front face to a side face. A tool foot at a bottom surface of the wedge wire bonding tool tip provides a contact surface for wire bonding. The tool foot has a geometric shape as defined by the front face, the chamfered face and the side face. The wedge wire bonding tool tip also has a bore through an upper portion of the tool tip above the tool foot for feeding a wire through the bore such that a portion of the wire may be interposed between the tool foot and the bonding pad of the semiconductor device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
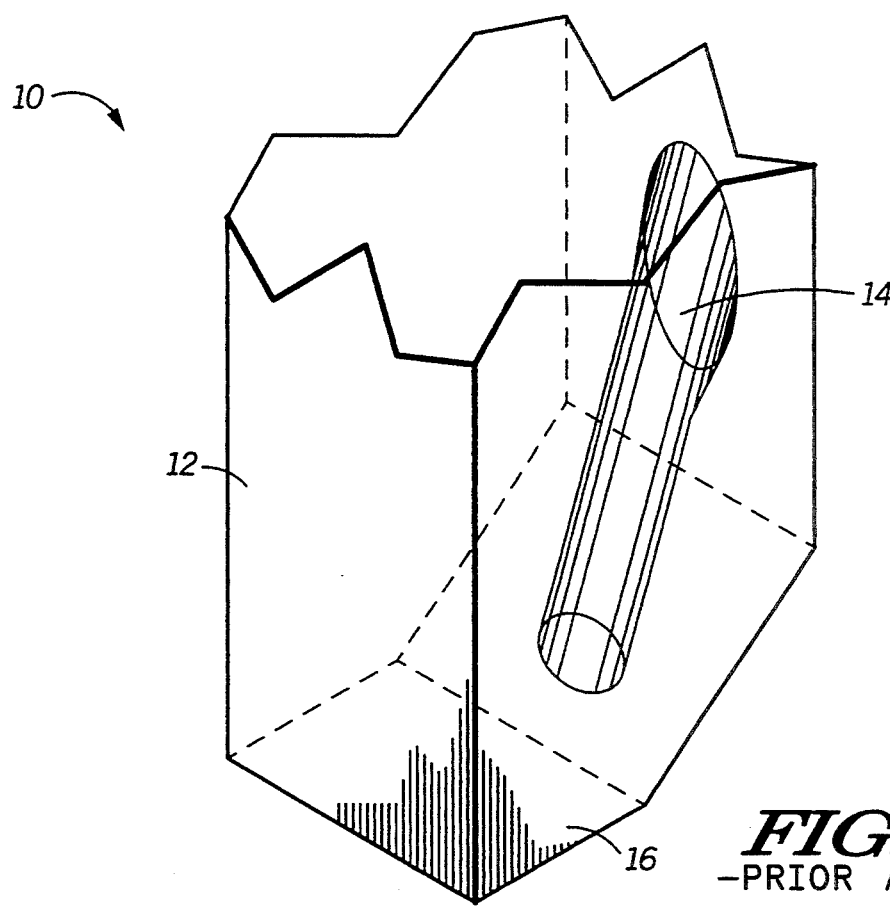
FIG. 1 illustrates, in a three dimensional view, a wedge wire bonding tool tip as known in the prior art.
Figure 2:
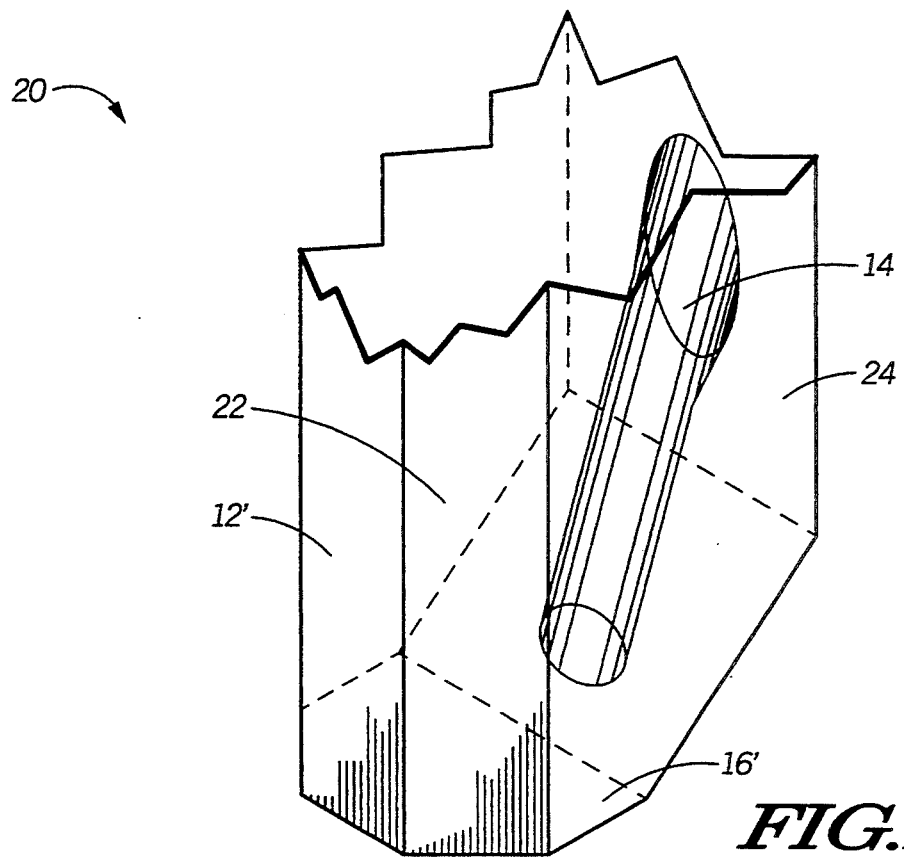
FIG. 2 illustrates, in a three dimensional view, a wedge wire bonding tool tip in accordance with a first embodiment of the present invention.

Various embodiments of the invention are now discussed in detail with reference to the figures. FIG. 2 illustrates a wedge wire bonding tool tip 20 in a first embodiment of the present invention. This wedge bonding tool tip 20 has a reduced front face 12' which is chamfered on both right and left sides, although only the right chamfered face 22 can be clearly seen in FIG. 2. The chamfer depth can typically range from 1/10 to ½ of the wedge tool width for wedge tools which have both sides chamfered, with substantially ¼ of the tool width being a preferred chamfer depth. The chamfer can be at any angle between the front face 12' and side faces 24 of the wedge bond tool tip 20. A practical range for the chamfer angle would be substantially in a range of 30° to 60°. Depending on the depth and angle of the chamfer, the contact distance for bond-pads can be reduced for wires which have incident angles greater than 0°. The bore 14 diameter, angles, and other wedge tool geometries would be of a similar configuration as existing wedge bonding tools. This design maintains the structural integrity needed to produce acceptable wedge bonds. Although not limited to the following list, the wedge bond tool tip 20 can be made of conventional materials such as tungsten carbide, titanium carbide, or hardened tool steel. The chamfering can be accomplished by machine grinding.

Figure 3:
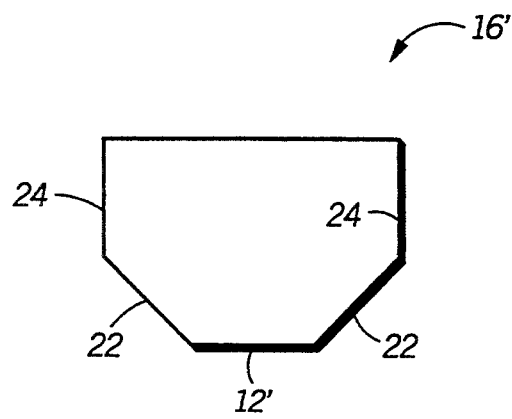
FIG. 3 illustrates, in a bottom view, the tool foot of the wedge wire bonding tool tip of FIG. 2.

FIG. 3 illustrates a bottom view of the tool foot 16' to more clearly show the desired shape of the foot. By reducing the front face width 12' approximately one wire diameter at some angle, such as 45°, to create right and left chamfers 22, the portion of the area of the wedge tool foot 16' which contacts the wire (not shown) remains consistent. The contact distance for wire bonds with a 45° incident angle can be reduced by more than ½ of one wire diameter. The chamfering can be made at angles other than 45° for minimizing the contact distance under a given set of conditions. For example, a chamfer angle for the wedge tool of 60° (as measured from the left and right sides) can be made for high incident angle bonds. Multiple or compound chamfers can also be made to reduce the contact distance for a range of incident wire bonding angles. An advantage associated with this embodiment of the present invention is that because the area of tool foot to wire contact remains consistent, the wedge bond parameter settings would be impacted only minimally.

For devices with a large number of bond-pads the minimum required pitch between two adjacent bond-pads for non-orthogonal bonds may define the lower limit of the die size. These dice are normally referred to as "pad limited." Since the chamfered wedge tools can reduce the contact distance, the bond-pad pitch may be similarly reduced which can lead to significant die size reduction for pad limited die.

As an alternative to the wedge bond tool tip 20 as illustrated in FIG. 2, only one side, either right or left, may be chamfered in order to reduce the potential for tool contact with an existing bond if wire bonding is performed in one direction only. For example, if bonding is to be made in a clockwise fashion then only the left side of the tool would need to be chamfered. In either left or right side chamfering, the wedge bond tool may be chamfered for its entire width.

Figure 5:
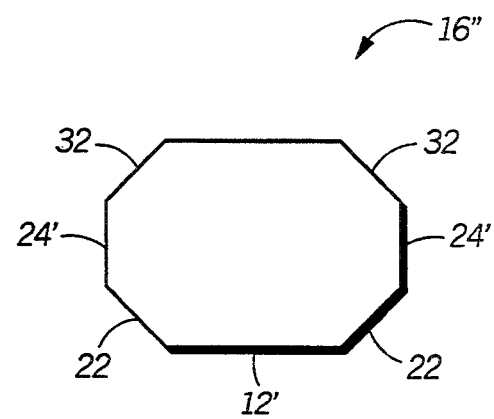
FIG. 5 illustrates, in a bottom view, the tool foot of the wedge wire bonding tool tip of FIG. 4.
Figure 4:
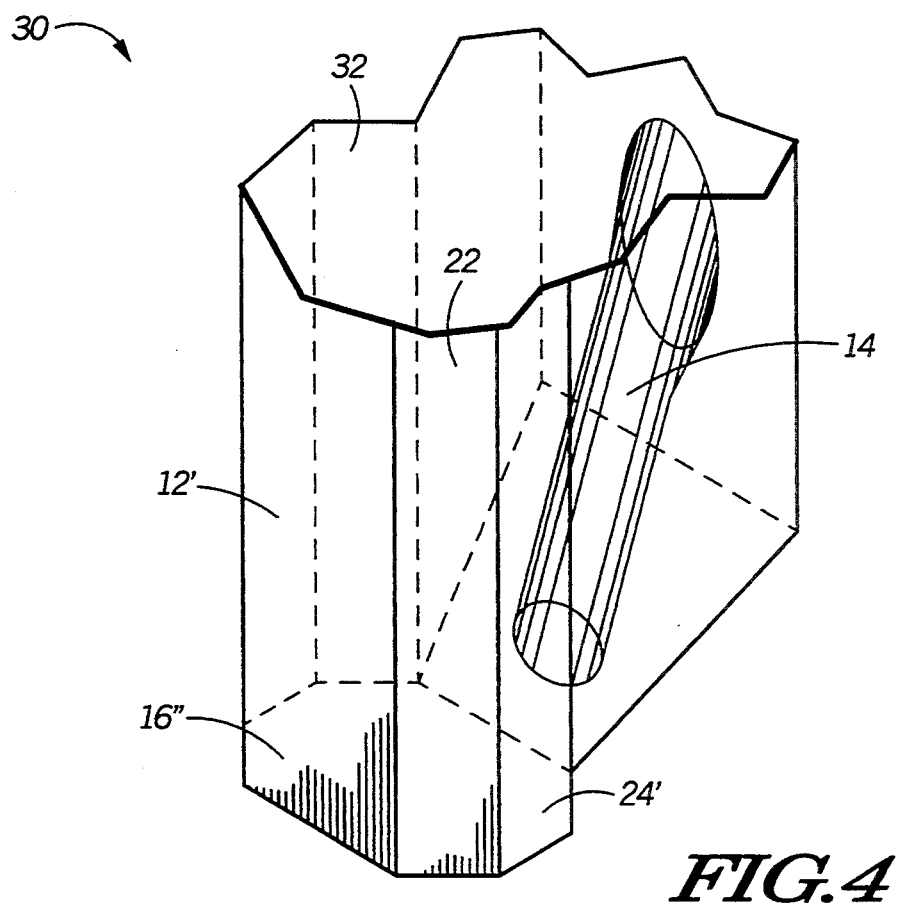
FIG. 4 illustrates, in a three dimensional view, a wedge wire bonding tool tip in accordance with a second embodiment of the present invention.

FIG. 4 illustrates another wedge wire bonding tool tip 30 in a second embodiment of the present invention. In this embodiment, the back corners of the tool tip are chamfered as well as the front corners to create back right and left chamfers 32, although only the left back chamfer 32 can clearly be seen in FIG. 4. A bottom view of the tool foot 16" is illustrated in FIG. 5 to clearly depict the "key-hole-like" shape of the tool foot 16". As in the first embodiment, the chamfer angles can be any suitable angle for a given set of geometric conditions. The chamfer depths, both front and back, can typically range from 1/10 to ¼ of the wedge tool width for wedge tools which have both sides chamfered, with substantially ¼ of the tool width being the preferred front and back chamfer depths. Since wire bonds are made sequentially, there is a possibility of a wedge tool foot contacting an existing bond both from the front corner of the tool foot as well as the back corner during non-orthogonal wire bonding. The two different types of contact occur at opposite angles. For example, if the front of the tool foot may contact an existing bond at an incident angle of 45° the back of the tool may contact an existing bond at an incident angle of −45°. An advantage of this embodiment of the invention is that the potential for the tool foot contacting the adjacent bond is further reduced by chamfering the back of the wedge tool as well as the front. The configuration of this second embodiment maintains the structural integrity need to produce acceptable wedge bonds by maintaining the original width of the wedge bond tool tip.

As an alternative to the wedge bond tool tip 30 as illustrated in FIG. 4, only one side, either right or left, may be chamfered in order to reduce the potential for tool contact with an existing bond if wire bonding is performed in one direction only. The specific application and preferred process attributes will define the bond geometries and which type of tool-to-bond contact is most likely to occur. With this understood, only the appropriate side and portion of the wedge tool need be double chamfered. For example, if bonding is to be made in a clockwise fashion and the contact between the front of the tool and an adjacent bond have been determined to have the highest probability of occurring, then only the left side of the tool need to be chamfered in practicing the present invention.

Figure 6:
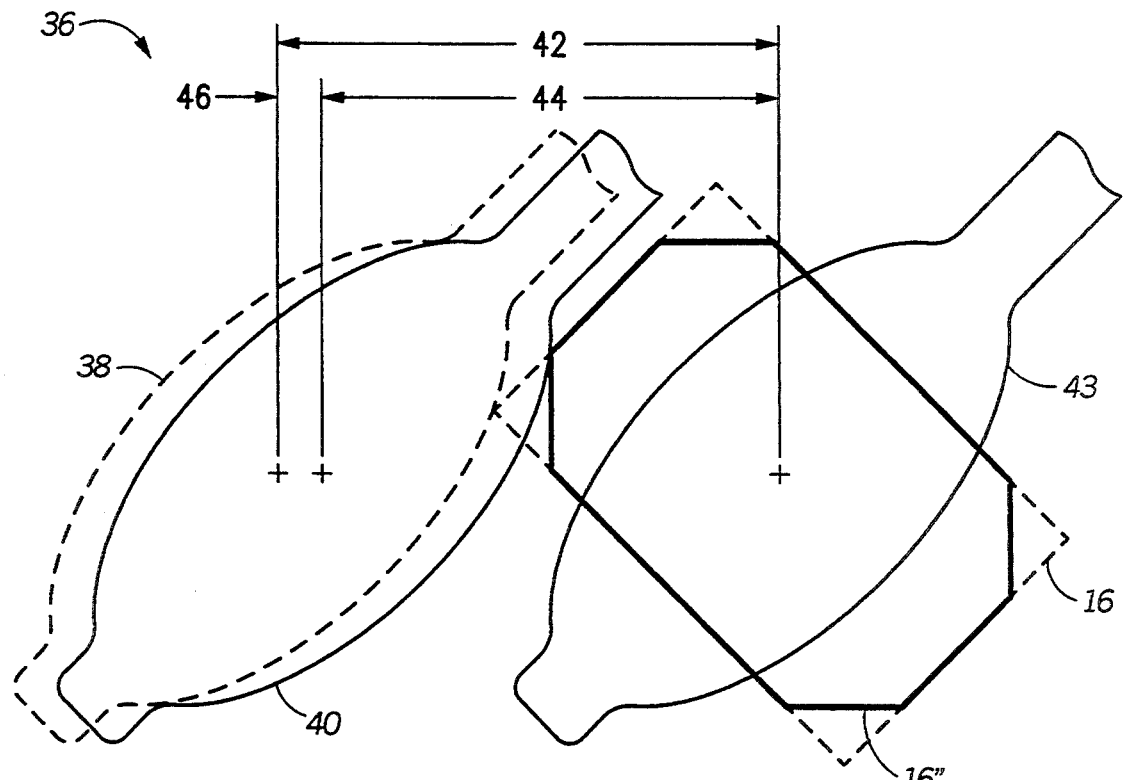
FIG. 6 illustrates, in a top view, relative positions of wedge bonds made with the tool tip of FIG. 4 and the prior art tool tip of FIG. 1 to demonstrate an advantage of the present invention.

FIG. 6 illustrates a set of adjacent wire bonds 36 made in accordance with the present invention to show the improvement in bond-pad pitch that resulting from practicing the present invention using the second embodiment as depicted in FIG. 4. The dotted lines illustrate a wire bond 38 and tool foot 16 as the prior art positions, while the solid lines illustrate the results of the present invention. Dimension 42 represents the critical pitch between two adjacent bond-pads at which a typical existing wedge tool with a rectangular tool foot 16 while forming a wire bond 43 would contact an existing first wire bond 38 as made in the prior art. However, by using the wedge tool of the present invention having tool foot 16" wherein the width of the front tool face has been reduced through chamfering, the bond-pad to bond-pad distance at which contact would be made with a previously made adjacent bond 40 can be reduced to dimension 44. The total reduction in pitch is represented by dimension 46. Hence, it should be clear that the minimum bond-pad pitch may be reduced by practicing the present invention while providing less potential for bond damage due to contact.

Figure 7:
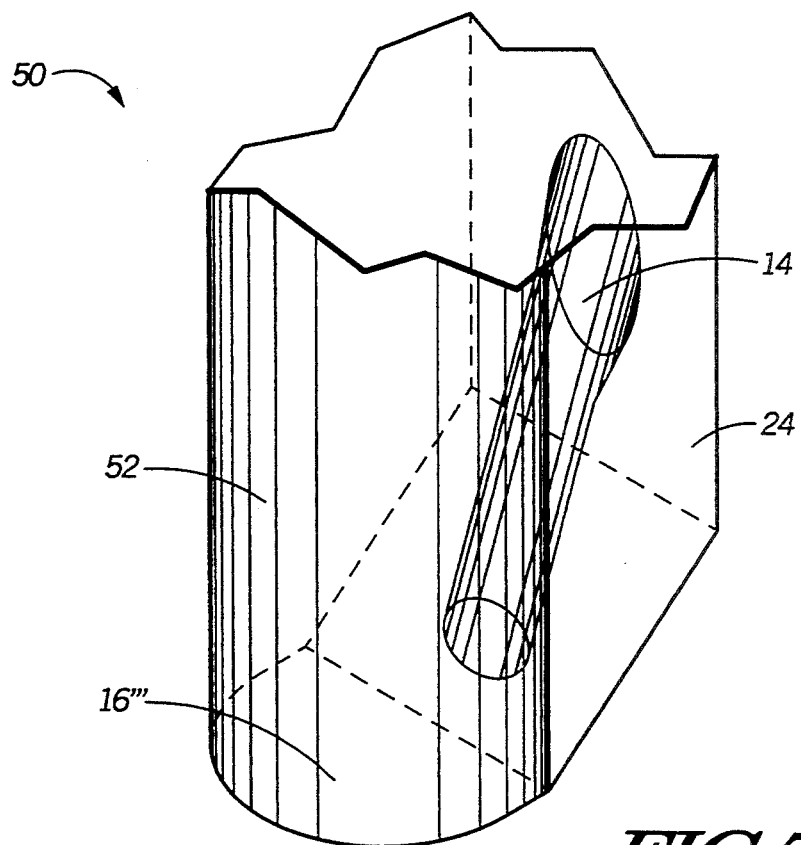
FIGS. 7 and 8 illustrate, in a three dimensional view, other wedge wire bonding tool tips in accordance with alternative embodiments of the present invention.
Figure 8:
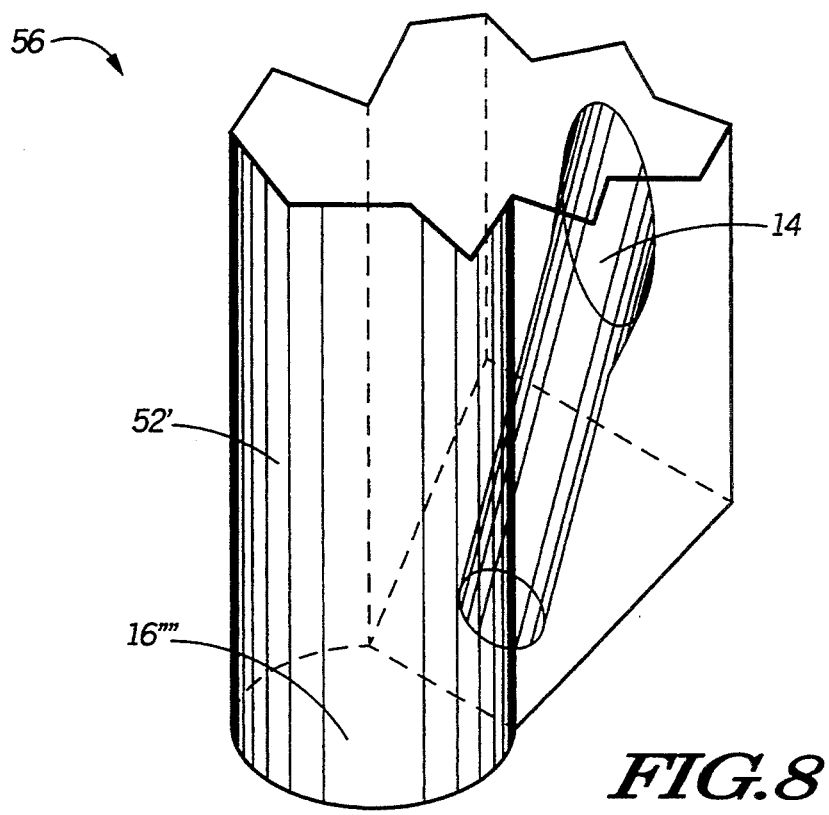

FIGS. 7 and 8 illustrate other wedge wire bonding tool tips 50 and 56 in a alternative embodiments of the invention. Suitable materials for the wedge wire bonding tools in these embodiments again include but are not limited to tungsten carbide, titanium carbide, and hardened tool steel. In FIG. 7, the front face 52 of the wedge tool is rounded in either a semi-circular or semi-elliptical shape. This further improves the distance at which wedge tool contact occurs to allow yet additional decrease in bond-pad pitch. In FIG. 8, the front and back faces of the wedge tool foot are rounded in either a near-circular or near-elliptical shape. This reduces the distance at which wedge tool contact occurs with an existing bond independent of bond direction. Both of these embodiments maintain the structural integrity need to produce acceptable wedge bonds by retaining the width of the contact area between the tool foot and the wire to be bonded.

Figure 9:
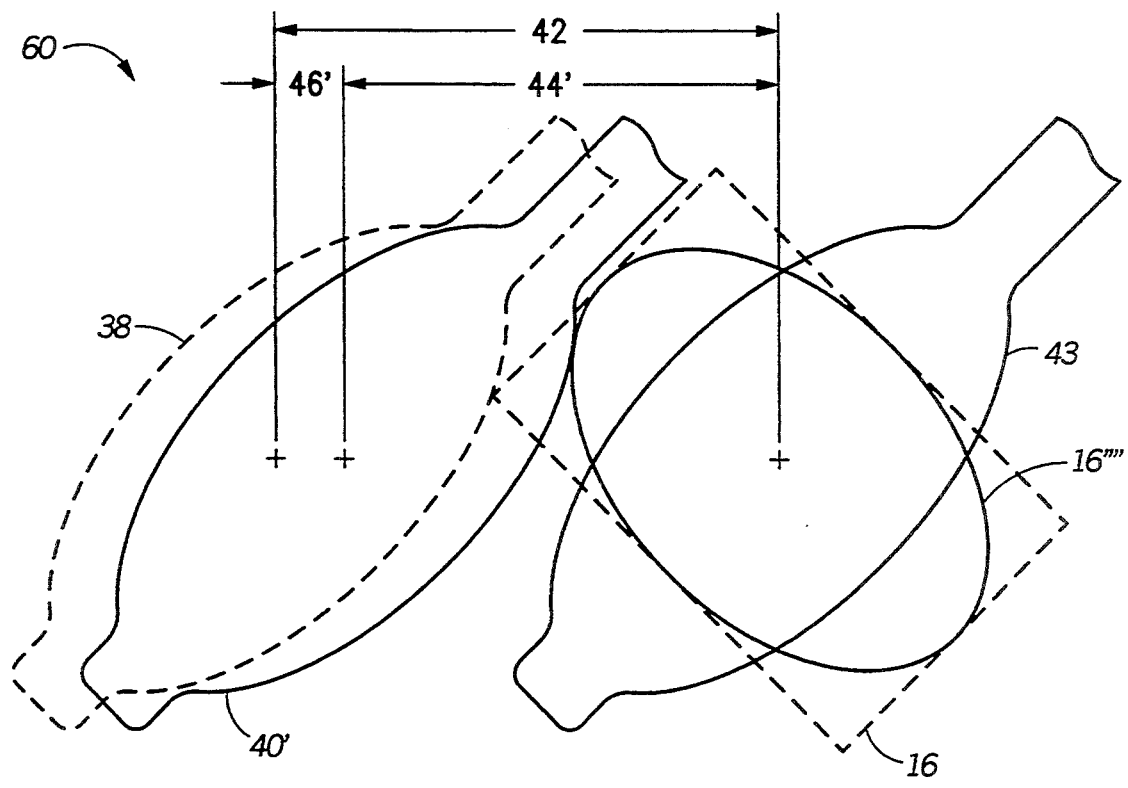
FIG. 9 illustrates, in a top view, relative positions of wedge bonds made with the tool tip of FIG. 8 and the prior art tool tip of FIG. 1 to demonstrate an advantage of the present invention.

FIG. 9 illustrates a set of adjacent wire bonds 60 made in accordance with the present invention to show the improvement in bond-pad pitch resulting from practicing the present invention using the embodiment as depicted in FIG. 8. Again, the dotted lines illustrate a wire bond 38 and tool foot 16 as the prior art positions, while the solid lines illustrate the results of the present invention. Dimension 42 represents the critical pitch between two adjacent bond-pads at which a typical existing wedge tool with a rectangular tool foot 16 while forming a wire bond 43 would contact an existing first wire bond 38 as made in the prior art. However, by using the wedge tool of the present invention having tool foot 16'''' wherein the front tool face has been rounded to eliminate all corners, the critical bond-pad pitch at which contact would be made with a previously made adjacent bond 40' can be reduced to dimension 44'. The total reduction in pitch is represented by dimension 46'. The dimension 46' in FIG. 9 shows an improvement over dimension 46 in FIG. 6 due to the complete rounding of the wedge tool foot. Hence, it should be clear that the minimum bond-pad pitch may be reduced by practicing the present invention while providing less potential for bond damage due to contact.

The foregoing description and illustrations contained herein demonstrate many of the advantages associated with the present invention. In particular, it has been revealed that a chamfered or rounded wedge wire bonding tool tip provides advantages in non-orthogonal wedge wire bonding over the prior art. Both the chamfered and the rounded tools allow the minimum bond-pad pitch to be reduced while reducing the potential for bond damage caused by tool contact. Moreover, pad limited die may benefit from the pitch reduction to enable further decreases in die size. Yet another advantage is that the present invention doers not require re-optimization of an established wedge wire bonding process because the same wire bonding parameters may be utilized in practicing the present invention as the contact area between the tool foot and the bond wire remains approximately the same between the prior art and the present invention.

Thus it is apparent that there has been provided, in accordance with the invention, a wedge wire bonding tool tip that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, multiple chamfers or reliefs may be added to further reduce the width of the front face as compared to the overall width of the wedge bond tool. In addition, the invention is not limited to any chamfer angle as the most suitable chamfer angle is dependent on the specific semiconductor die pad layout and pad pitch. It is also important to note that the present invention is not limited in any way to any particular type of wedge bonding tool. Therefore, it is intended that this invention encompass all such variations and modifications falling within the scope of the appended claims.

What is claimed is:

1. A wedge wire bonding tool tip, for bonding electronic interconnects to bonding pads of a semiconductor device, having a width of a first dimension, a front face having a second dimension which is smaller than the first dimension, a side face, a chamfered face at a predetermined angle connecting the front face to the side face, a tool foot at a bottom surface of the wedge wire bonding tool tip for making contact with a wire, and a bore through an upper portion of the wedge wire bonding tool tip above the tool foot for feeding the wire through the bore such that a portion of the wire may be interposed between the tool foot and the bonding pad of the semiconductor device.

2. The wedge wire bonding tool tip of claim 1, wherein the predetermined angle of the chamfered face is substantially in a range of 30° to 60°.

3. The wedge wire bonding tool tip of claim 1, wherein the side face and the chamfered face are found on both left and right portions of the tool tip such that the tool foot has a polygonal shape having six sides.

4. The wedge wire bonding tool tip of claim 1, wherein the chamfered face has a depth substantially in a range of 1/10 to ½ of the first dimension.

5. The wedge wire bonding tool tip of claim 1, further having a second chamfered face at a second predetermined angle at a back portion of the tool tip.

6. The wedge wire bonding tool tip of claim 5, wherein the side face and the first and second chamfered faces are found on both left and right portions of the tool tip such that the tool foot has a polygonal shape having eight sides.

7. The wedge wire bonding tool tip of claim 5, wherein the first and second chamfered faces have a depth substantially in a range of 1/10 to ¼ of the first dimension.

8. The wedge wire bonding tool tip of claim 5, wherein the second predetermined angle of the second chamfered face is substantially in a range of 30° to 60°.

9. The wedge wire bonding tool of tip of claim 1, being of a material selected from a group consisting of: tungsten carbide, titanium carbide, and hardened tool steel.

10. A wedge wire bonding tool tip, for bonding electronic interconnects to bonding pads of a semiconductor device, having a width of a first dimension, a front face that is nonplanar, a tool foot at a bottom surface of the wedge wire bonding tool tip for making contact with a wire wherein the tool foot is substantially perpendicular to the front face, and a bore through an upper portion of the wedge wire bonding tool tip above the tool foot for feeding the wire through the bore such that a portion of the wire may be interposed between the tool foot and the bonding pad of the semiconductor device.

11. The wedge wire bonding tool tip of claim 10, wherein the front face is further characterized as being rounded in a semi-circular shape such that the tool foot has a same semi-circular shape.

12. A wedge wire bonding tool tip, for bonding electronic interconnects to bonding pads of a semiconductor device, having a width of a first dimension, a front face that is rounded, a tool foot at a bottom surface of the wedge wire bonding tool tip for making contact with a wire, and a bore through an upper portion of the wedge wire bonding tool tip above the tool foot for feeding the wire through the bore such that a portion of the wire may be interposed between the tool foot and the bonding pad of the semiconductor device, wherein the front face is further characterized as being rounded in a semi-elliptical shape such that the tool foot has a same semi-elliptical shape.

13. A wedge wire bonding tool tip, for bonding electronic interconnects to bonding pads of a semiconductor device, having a width of a first dimension, a front face that is rounded, a tool foot at a bottom surface of the wedge wire bonding tool tip for making contact with a wire, and a bore through an upper portion of the wedge wire bonding tool tip above the tool foot for feeding the wire through the bore such that a portion of the wire may be interposed between the tool foot and the bonding pad of the semiconductor device, wherein a back portion of the wedge tool tip is rounded such that the tool foot has a near-circular shape.

14. A wedge wire bonding tool tip, for bonding electronic interconnects to bonding pads of a semiconductor device, having a width of a first dimension, a front face that is rounded, a tool foot at a bottom surface of the wedge wire bonding tool tip for making contact with a wire, and a bore through an upper portion of the wedge wire bonding tool tip above the tool foot for feeding the wire through the bore such that a portion of the wire may be interposed between the tool foot and the bonding pad of the semiconductor device, wherein a back portion of the wedge tool tip is rounded such that the tool foot has a near-elliptical shape.

15. The wedge wire bonding tool of tip of claim 10, being of a material selected from a group consisting of: tungsten carbide, titanium carbide, and hardened tool steel.

* * * * *